US011223269B2

(12) United States Patent
Tao et al.

(10) Patent No.: US 11,223,269 B2
(45) Date of Patent: Jan. 11, 2022

(54) CIRCUIT FOR CONTROLLING SWITCHING POWER SUPPLY BY CURRENT LIMITING AND MAGNETIC FIELD DETECTION, AND METHOD FOR CONTROLLING SWITCHING POWER SUPPLY BY USING CIRCUIT

(71) Applicant: Wuxi Chipown Microelectronics Co., Ltd., Jiangsu (CN)

(72) Inventors: Ping Tao, Wuxi (CN); Haijun Zhou, Wuxi (CN); Haisong Li, Wuxi (CN); Yangbo Yi, Wuxi (CN); Wei Gao, Wuxi (CN)

(73) Assignee: WUXI CHIPOWN MICROELECTRONICS CO., LTD., Wuxi Jiangsu (CN)

( * ) Notice: Subject to any disclaimer, the term of this patent is extended or adjusted under 35 U.S.C. 154(b) by 0 days.

(21) Appl. No.: 16/931,980

(22) Filed: Jul. 17, 2020

(65) Prior Publication Data

US 2021/0336554 A1 Oct. 28, 2021

(30) Foreign Application Priority Data

Apr. 24, 2020 (CN) .......................... 202010333412.2

(51) Int. Cl.
*H02M 1/44* (2007.01)
*H02M 1/00* (2006.01)

(52) U.S. Cl.
CPC ....... *H02M 1/0025* (2021.05); *H02M 1/0009* (2021.05); *H02M 1/44* (2013.01); *H02M 1/0019* (2021.05)

(58) Field of Classification Search
CPC .... H02M 1/44; H02M 1/0025; H02M 1/0009; H02M 1/0019
See application file for complete search history.

(56) References Cited

U.S. PATENT DOCUMENTS

2015/0180337 A1\* 6/2015 Ooga ..................... H05B 45/37
315/200 R
2017/0194858 A1\* 7/2017 Villot ..................... H02M 1/32

\* cited by examiner

*Primary Examiner* — Peter M Novak
(74) *Attorney, Agent, or Firm* — Gregory M. Howison

(57) ABSTRACT

A circuit for controlling a switching power supply and a method for controlling a switching power supply by using the circuit for controlling the switching power supply, the circuit for controlling a switching power supply is configured to control a power stage circuit of a converter of the switching power supply. The circuit for controlling the switching power supply includes an external magnetic field direct detection unit, a current limit threshold unit, an operating frequency unit, a pulse width unit and a logic unit. The external magnetic field direct detection unit includes a Hall device and a Hall detection component. In accordance with the circuit for controlling the switching power supply of the present disclosure, the intensity of the external magnetic field can be detected directly at the chip level, and the operating mode of the switching power supply system can be adjusted timely.

10 Claims, 3 Drawing Sheets

CIRCUIT FOR CONTROLLING SWITCHING POWER SUPPLY BY CURRENT LIMITING AND MAGNETIC FIELD DETECTION, AND METHOD FOR CONTROLLING SWITCHING POWER SUPPLY BY USING CIRCUIT

CROSS-REFERENCE TO RELATED APPLICATIONS

The present application claims the priority of the Chinese Patent Application No. 202010333412.2, filed on Apr. 24, 2020 and titled CIRCUIT FOR CONTROLLING SWITCHING POWER SUPPLY AND METHOD FOR CONTROLLING SWITCHING POWER SUPPLY BY USING CIRCUIT, and the content of which is incorporated by reference herein in its entirety, the specification of which is incorporated by reference herein in its entirety.

TECHNICAL FIELD

The present disclosure relates to a power supply circuit and a control method for using the power supply. The disclosure belongs to the technical field of the switching power supplies.

BACKGROUND

As one of the important components in various electric devices and electric apparatuses, a switching power supply is widely used in various fields of the prior art due to its advantages of small size, fast transient response and low loss. However, smart electricity meters have a special problem in utilizing switching power supplies. That is, when the electricity meter is interfered by an outside strong magnetic field, a normal operation of a switching power supply device or a module inside the electricity meter will be affected, thus disabling the electricity meter to accurately measure an amount of electricity, and further exasperating electricity theft and affecting national economic construction and social stability.

Regarding this problem, some corresponding technical solutions have also appeared in the industry. The solutions mainly include providing a magnetic field shielding shell outside the meter, or designing and manufacturing an inductance or transformer in the switching power supply with special materials and by special processes. In practical application, persons skilled in the art found that although the above technical solutions can reduce interference of the magnetic field on the switching power supply to a certain extent, a size of the meter and whole manufacturing costs of the switching power supply are greatly increased.

Along with continuous updating and iteration of technology, in order to better solve the above technical problems, some switching power supplies with anti-magnetic interference capabilities have also appeared in the industry. For example, in Chinese Patent Application 106655823A, an anti-magnetic interference switching power supply, a control circuit and a control method therefor are provided. In this control circuit, a magnetic field detection unit determines whether the power supply is affected by an external magnetic field on the basis of detecting a magnitude of a value of an error amplification signal COMP and a gradient Rcs of a current detection signal CS. When a result of the determination is that the power supply is interfered by the external magnetic field, an operating frequency of the switching power supply will be increased to N times. To some extent, this solution can effectively improve a load capacity of the switching power supply in the magnetic field and reduce the interference of the magnetic field on the switching power supply.

However, it should be noted that this control circuit still has some significant deficiencies in a manner of detecting the magnetic field and frequency doubling. Specifically, firstly, in this solution, there is no direct corresponding relationship between a magnitude of the external magnetic field and the value of the error amplification signal COMP, and the accuracy of the result of the determination is questionable. Secondly, input voltages and inductance values of magnetic elements of different switching power supplies are also tremendously different, which also causes the gradient Rcs of the current detection signal CS to show different values under a same intensity of the external magnetic field. In this case, if the control circuit determines the interference of the external magnetic field merely on the basis of variations in an output voltage and the gradient of the current detection signal of the switching power supply, problems of false detections or low detection accuracy will occur in some application scenarios that are sensitive to the intensity of the external magnetic field. Further, when the control circuit detects the interference of external magnetic field, the operating frequency will be changed to N times of the original frequency abruptly. Such an adjustment method will undoubtedly affect an overall stability of the switching power supply, and even cause the switching power supply to fail to operate normally in the worst case.

In summary, no matter which prior art are applied, there are many problems that need to be solved and improved. Therefore, it has become an urgent problem to be solved by the persons skilled in the art on how to propose a novel, self-adaptive technology for the switching power supply that can overcome the above mentioned defects on the basis of an existing research foundation.

SUMMARY

In view of the above defects in the prior art, an objective of the present disclosure is to provide a circuit for controlling a switching power supply and a method for controlling a switching power supply by using the circuit.

A circuit for controlling a switching power supply, configured to control a power stage circuit of a converter of the switching power supply, and including an external magnetic field direct detection unit configured to: detect an intensity of an external magnetic field directly, and generate a corresponding logic signal to control a switching frequency output by the operating frequency unit and to adjust a current limit threshold in the current limit threshold unit, a current limit threshold unit configured to receive an output signal of the external magnetic field direct detection unit and limit a maximum current flowing through a magnetic element in the power stage circuit, an operating frequency unit controlled by the external magnetic field direct detection unit and a feedback signal processed by a feedback loop, and configured to generate a corresponding frequency signal to control a power switching transistor in the power stage circuit to turn on or off, a pulse width unit configured to receive the feedback signal processed by the feedback loop and a sampling signal at a current sampling terminal, and control an on-off duty ratio of the power switching transistor in the power stage circuit, a logic unit configured to receive output signals from the current limit threshold unit, the operating frequency unit and the pulse width unit, and perform a logic processing and generate a corresponding driving signal to control the power switching transistor in the power stage circuit to turn on or be off The external magnetic field direct detection unit includes a Hall device and a Hall detection component.

The Hall device is configured to detect the intensity of the external magnetic field directly and convert the intensity of the external magnetic field into an internal voltage signal.

The Hall detection component is configured to receive the internal voltage signal generated by the Hall device, and generate the corresponding logic signal after amplification and comparison.

In an embodiment, the power stage circuit includes at least the magnetic element, an output unit, the power switching transistor, a sampling resistor, and the converter of the switching power supply includes the feedback loop.

The power switching transistor is electrically connected to the sampling resistor, and a position in a connection between the power switching transistor and the sampling resistor is the current sampling terminal of the circuit for controlling the switching power supply.

The feedback loop is electrically connected to the operating frequency unit and the pulse width unit respectively.

In an embodiment, an input end of the external magnetic field direct detection unit is magnetically connected to the external magnetic field, and an output end of the external magnetic field direct detection unit is electrically connected to a first input end of the current limit threshold unit and a first input end of the operating frequency unit respectively.

The first input end of the current limit threshold unit is electrically connected to the output end of the external magnetic field direct detection unit, a second input end of the current limit threshold unit is electrically connected to the current sampling terminal; and an output end of the current limit threshold unit is electrically connected to a first input end of the logic unit.

The first input end of the operating frequency unit is electrically connected to the output end of the external magnetic field direct detection unit, a second input end of the operating frequency unit is electrically connected to an output end of the feedback loop, and an output end of the operating frequency unit is electrically connected to a second input end of the logic unit.

A first input end of the pulse width unit is electrically connected to the output end of the feedback loop, a second input end of the pulse width unit is electrically connected to the current sampling terminal, and an output end of the pulse width unit is electrically connected to a third input end of the logic unit.

The first input end of the logic unit is electrically connected to the output end of the current limit threshold unit, the second input end of the logic unit is electrically connected to the output end of the operating frequency unit, the third input end of the logic unit is electrically connected to the output end of the pulse width unit, and the output end of the logic unit is electrically connected to the power switching transistor.

In an embodiment, the Hall device is a chip-level Hall device integrated in a switching power supply chip, and an integrated Hall device is formed by combining one or more process devices.

In an embodiment, an external shape of the Hall device is center symmetrical and has four ports for connection; a first port and a second port are arranged along a diagonal direction of the Hall device; and a third port and a fourth port are arranged in another diagonal direction of the Hall device.

In an embodiment, the Hall detection component includes a first current source, a first amplifier, and a first comparator.

An output of the first current source is electrically connected to the first port of the Hall device, and the second port of the Hall device is electrically connected to a ground potential.

A first input end of the first amplifier is electrically connected to the third port of the Hall device; a second input end of the first amplifier is electrically connected to the fourth port of the Hall device, a first output end of the first amplifier is electrically connected to a first input end of the first comparator, and a second output end of the first amplifier is electrically connected to a second input end of the first comparator.

The first input end of the first comparator is electrically connected to the first output end of the first amplifier, the second input end of the first comparator is electrically connected to the second output end of the first amplifier, and an output end of the first comparator serves as the output end of the external magnetic field direct detection unit and is electrically connected to the first input end of the current limit threshold unit and the first input end of the operating frequency unit respectively.

In an embodiment, the current limit threshold unit includes an overcurrent threshold selector and an OCP comparator.

A first input end of the overcurrent threshold selector serves as the first input end of the current limit threshold unit and is electrically connected to the output end of the first comparator, a second input end of the overcurrent threshold selector is electrically connected to the first threshold voltage, a third input end of the overcurrent threshold selector is electrically connected to the second threshold voltage, and an output end of the overcurrent threshold selector is electrically connected to a first input end of the OCP comparator.

The first input end of the OCP comparator is electrically connected to the output end of the overcurrent threshold selector, a second input end of the OCP comparator serves as the second input end of the current limit threshold unit and is electrically connected to the current sampling terminal, and an output end of the OCP comparator serves as the output end of the current limit threshold unit and is electrically connected to the first input end of the logic unit.

In an embodiment, the operating frequency unit includes a second comparator, a third comparator, an RS trigger, a second current source, a third current source, and a first switch, a second switch, a first capacitor, a third switch, a voltage-controlled current source and a subtracter.

A first input end of the second comparator is electrically connected to a third threshold voltage, a second input end of the second comparator is electrically connected to an end of the first capacitor, and an output end of the second comparator is electrically connected to a first input end of the RS trigger.

A first input end of the third comparator is electrically connected to the second input end of the second comparator, a second input end of the third comparator is electrically connected to a fourth threshold voltage, and an output end of the third comparators is electrically connected to a second input end of the RS trigger.

The first input end of the RS trigger is electrically connected to the output end of the second comparator, the second input end of the RS trigger is electrically connected to the output end of the third comparator, and an output end of the RS trigger is electrically connected to a third connection end of the first switch and a third connection end of the second switch respectively.

An end of the second current source is electrically connected to an internal power supply, and another end of the second current source is electrically connected to a first connection end of the first switch.

An end of the third current source is electrically connected to a second connection end of the second switch, and another end of the third current source is electrically connected to the ground potential.

The first connection end of the first switch is electrically connected to the second current source, a second connection end of the first switch is electrically connected to the second input end of the second comparator, and the third connection end of the first switch is electrically connected to the output end of the RS trigger.

A first connection end of the second switch is electrically connected to the second input end of the second comparator, the second connection end of the second switch is electrically connected to the third current source, and the third connection end of the second switch is electrically connected to the output end of the RS trigger.

An end of the first capacitor is electrically connected to the second input end of the second comparator, and another end of the first capacitor is electrically connected to the ground potential.

A first connection end of the third switch is electrically connected to a fourth connection end of the voltage-controlled current source, a second connection end of the third switch is electrically connected to the second input end of the second comparator, and a third connection end of the third switch is electrically connected to the output end of the first comparator.

A first connection end of the voltage-controlled current source is electrically connected to an output end of the subtracter, a second connection end of the voltage-controlled current source is electrically connected to the ground potential, a third connection end of the voltage-controlled current source is electrically connected to the internal power supply, and the fourth connection end of the voltage-controlled current source is electrically connected to the first connection end of the third switch.

A first input end of the subtracter is electrically connected to the output end of the feedback loop, a second input end of the subtracter is electrically connected to a fifth threshold voltage, and the output end of the subtracter is electrically connected to the first connection end of the voltage-controlled current source.

A method for controlling a switching power supply by using the circuit for controlling the switching power supply described above is provided. The method includes the following steps.

Power on and start the circuit for controlling the switching power supply,

Detect, by the external magnetic field direct detection unit, the intensity of the external magnetic field directly, and compare detected intensity of the external magnetic field with a preset magnetic field intensity threshold.

If the detected intensity of the external magnetic field is greater than the preset magnetic field intensity threshold, set the switching power supply in a strong magnetic field operating mode, in which the current limit threshold unit adjusts a current limit threshold voltage from a first threshold voltage to a second threshold voltage, and the voltage-controlled current source in the operating frequency unit is then turned on. A value of the second threshold voltage is not less than a value of the first threshold voltage.

If the detected intensity of the external magnetic field is not greater than the preset magnetic field intensity threshold, keep the switching power supply always in a normal operating mode, in which the current limit threshold unit keeps the current limit threshold voltage being the first threshold voltage, and the voltage-controlled current source in the operating frequency unit remains off.

Advantages of the present disclosure are mainly reflected in the following aspects.

In accordance with the circuit for controlling the switching power supply of the present disclosure, the intensity of the external magnetic field can be detected directly at the chip level, and the operating mode of the switching power supply system can be adjusted timely. Compared with a traditional technical solution, a judgment is made without detecting other signals inside the control circuit, thereby not only ensuring accuracy of a detection result, but also greatly reducing the number of discrete components in an external magnetic field detection section of the switching power supply, and reducing a whole cost for manufacturing the switching power supply system.

Moreover, in accordance with the circuit for controlling the switching power supply of the present disclosure, after the intensity of the external magnetic field is detected, and the voltage-controlled current source in the operating frequency unit is turned on, a maximum frequency output by the operating frequency unit will be linearly controlled by the feedback signal, rather than the frequency is simply changed from a first preset value to a second preset value abruptly. Such an operation mode can improve operating stability of the switching power supply system effectively and avoid system oscillations.

The circuit for controlling the switching power supply of the present disclosure can be directly applied to a smart electric meter interfered by the external magnetic field. When there is no magnetic field outside the smart electric meter or the intensity of the magnetic field is not greater than a threshold, the switching power supply system is in the normal operating mode; while when the intensity of the magnetic field outside the smart electric meter is greater than the threshold, the switching power supply system is switched to the strong magnetic field operating mode. By switching between the above operating modes, the operating stability of the switching power supply can be effectively improved and interference of the magnetic field on the switching power supply can be reduced.

Embodiments of the present disclosure will be further described in detail below with reference to the drawings of the embodiments, so as to make it easier to understand and comprehend the technical solutions of the present disclosure.

DETAILED DESCRIPTION

An objective of the present disclosure is to provide a circuit for controlling a switching power supply and a method for controlling a switching power supply by using the circuit, and will be described as follows.

Figure 1:
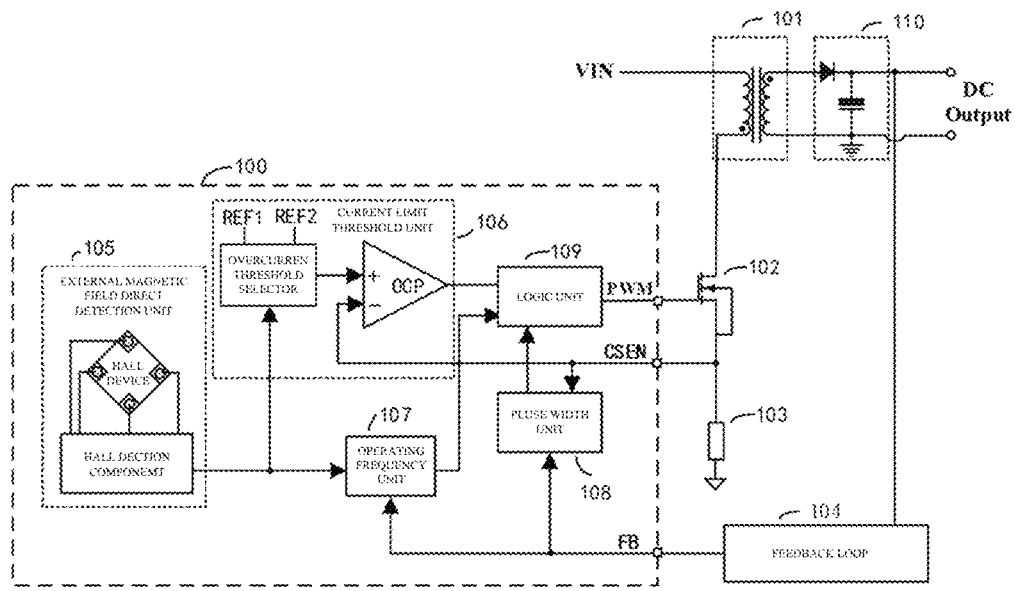
FIG. 1 is a schematic diagram illustrating an overall structure of a circuit for controlling a switching power supply of the present disclosure.

As shown in FIG. 1, a circuit 100 for controlling a switching power supply is configured to control a power stage circuit of a converter of a switching power supply. The power stage circuit can have various implementation forms. In an embodiment, the power stage circuit is preferably a power stage circuit of a flyback converter of the switching power supply.

Specifically, the power stage circuit includes at least a magnetic element 101, an output unit 110, a power switching transistor 102, and a sampling resistor 103. The converter of the switching power supply includes a feedback loop 104.

Similarly, the magnetic element 101 can also have various implementation forms. In an embodiment, the magnetic element 101 has a dual-winding structure and is configured to receive an input voltage. Specifically, one side of the magnetic element 101 is sequentially connected to the power switching transistor 102 and the sampling resistor 103. The sampling resistor 103 is electrically connected to the ground potential. A position in a connection between the power switching transistor 102 and the sampling resistor 103 is a current sampling terminal of the circuit 100 for controlling the switching power supply. Another side of the magnetic element 101 is sequentially connected to the output unit 110 and the feedback loop 104. The feedback loop 104 is electrically connected to an operating frequency unit 107 and a pulse width unit 108 respectively.

The circuit 100 for controlling the switching power supply includes an external magnetic field direct detection unit 105, a current limit threshold unit 106, the operating frequency unit 107, the pulse width unit 108, and a logic unit 109.

Further, the external magnetic field direct detection unit 105 is configured to: detect an intensity of an external magnetic field directly, and generate a corresponding logic signal to control a switching frequency output by the operating frequency unit 107 and to adjust a current limit threshold in the current limit threshold unit 106.

The current limit threshold unit 106 is configured to receive an output signal of the external magnetic field direct detection unit 105 and limit a maximum current flowing through the magnetic element 101 in the power stage circuit.

The operating frequency unit 107 is controlled by the external magnetic field direct detection unit 105 and a feedback signal processed by the feedback loop 104, and is configured to generate a corresponding frequency signal to control the power switching transistor 102 in the power stage circuit to turn on or off.

The pulse width unit 108 is configured to receive the feedback signal processed by the feedback loop 104 and the sampling signal at the current sampling terminal, and control an on-off duty ratio of the power switching transistor 102 in the power stage circuit.

The logic unit 109 is configured to receive output signals from the current limit threshold unit 106, the operating frequency unit 107 and the pulse width unit 108, and perform a logic processing and generate a corresponding driving signal to control the power switching transistor 102 in the power stage circuit to turn on or be off.

A specific connection mode among the above sections is as follows.

An input end of the external magnetic field direct detection unit 105 is magnetically connected to the external magnetic field, so as to detect the intensity of the external magnetic field directly and generate the corresponding logic signal. An output end of the external magnetic field direct detection unit 105 is electrically connected to a first input end of the current limit threshold unit 106 and a first input end of the operating frequency unit 107 respectively.

The first input end of the current limit threshold unit 106 is electrically connected to the output end of the external magnetic field direct detection unit 105; a second input end of the current limit threshold unit 106 is electrically connected to the current sampling terminal and configured to receive the sampling signal; and an output end of the current limit threshold unit 106 is electrically connected to a first input end of the logic unit 109.

The first input end of the operating frequency unit 107 is electrically connected to the output end of the external magnetic field direct detection unit 105; a second input end of the operating frequency unit 107 is electrically connected to an output end of the feedback loop 104; and an output end of the operating frequency unit 107 is electrically connected to the second input end of the logic unit 109.

A first input end of the pulse width unit 108 is electrically connected to the output end of the feedback loop 104; a second input end of the pulse width unit 108 is electrically connected to the current sampling terminal; and an output end of the pulse width unit 108 is electrically connected to a third input end of the logic unit 109.

The first input end of the logic unit 109 is electrically connected to the output end of the current limit threshold unit 106; the second input end of the logic unit 109 is electrically connected to the output end of the operating frequency unit 107; the third input end of the logic unit 109 is electrically connected to the output end of the pulse width unit 108; and the output end of the logic unit 109 is electrically connected to the power switching transistor 102, so as to control the power switching transistor 102 to turn on or off.

Based on the above technical description, it can be seen that, in accordance with the circuit 100 for controlling the switching power supply of the present disclosure, a constant output voltage is ensured by controlling the power switching transistor 102 to turn on or off; the output voltage is fed back through the feedback loop 104 to regulate the pulse width unit 108 and the operating frequency unit 107, thereby realizing an adjustment of the duty ratio and the frequency of the power switching transistor 102.

When a switching power supply system is interfered by the external magnetic field, the external magnetic field direct detection unit 105 will detect the intensity of the external magnetic field directly. When the detected intensity of the external magnetic field is greater than a certain magnetic field threshold, the external magnetic field direct detection unit 105 will output a logic signal different from another logic signal output when there is no magnetic field intensity.

The logic signal controls the current limit threshold unit 106 to change a threshold voltage in the current limit threshold unit 106 from a first threshold voltage to a second threshold voltage. At the same time, the logic signal controls a third switch 309 in the operating frequency unit 107 to be turned on, and at this time, current flowing through a first capacitor 308 includes a second current source 304 and a third current source 307 that flows originally, as well as a voltage-controlled current source 310 controlled by a subtracter 311, specifically controlled by a difference between the feedback signal and a fifth threshold voltage), so that the frequency output by the operating frequency unit 107 changes linearly.

In accordance with the above circuit 100 for controlling the switching power supply, by adjusting the threshold voltage of the current limit threshold unit 106 and controlling the voltage-controlled current source 310 of the operating frequency unit 107, an anti-interference capability and stability of the whole switching power supply under the magnetic field can be greatly enhanced.

Figure 2:
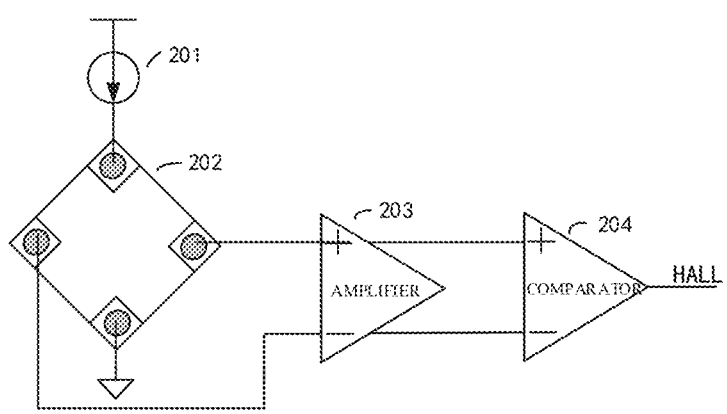
FIG. 2 is a schematic diagram illustrating a simplified structure of an external magnetic field direct detection unit.

As shown in FIG. 2, the external magnetic field direct detection unit 105 includes a Hall device 202 and a Hall detection component. The Hall device 202 is configured to detect the intensity of the external magnetic field directly and convert the intensity of the external magnetic field into an internal voltage signal. The Hall detection component is configured to receive the internal voltage signal generated by the Hall device 202, and generate the corresponding logic signal after amplification and comparison.

The Hall device 202 is a chip-level Hall device 202 integrated in a switching power supply chip, and an integrated Hall device 202 can be formed by combining one or more process devices. In an embodiment, an external shape of the Hall device 202 is center symmetrical and has four ports for connection. A first port and a second port are arranged along a diagonal direction of the Hall device 202, and a third port and a fourth port are arranged along another diagonal direction of the Hall device 202. The second port of the Hall device 202 is electrically connected to the ground potential.

The Hall detection component includes a first current source 201, a first amplifier 203 and a first comparator 204.

The first current source 201 is configured to cooperate with the Hall device 202 to detect the intensity of the external magnetic field. An output end of the first current source 201 is electrically connected to the first port of the Hall device 202.

The first amplifier 203 is configured to receive the internal voltage signal generated by the Hall device 202 and amplify the internal voltage signal and input the amplified internal voltage signal into the first comparator 204. A first input end of the first amplifier 203 is electrically connected to the third port of the Hall device 202; a second input end of the first amplifier 203 is electrically connected to the fourth port of the Hall device 202; a first output end of the first amplifier 203 is electrically connected to the first input end of the first comparator 204; and the second output end of the first amplifier 203 is electrically connected to a second input end of the first comparator 204.

The first comparator 204 is configured to receive the output signal of the first amplifier 203 and generate a corresponding logic output signal. The first input end of the first comparator 204 is electrically connected to the first output end of the first amplifier 203, and the second input end of the first comparator 204 is electrically to the second output end of the first amplifier 203. An output end of the first comparator 204 serves as the output end of the external magnetic field direct detection unit 105 and is electrically connected to the first input end of the current limit threshold unit 106 and the first input end of the operating frequency unit 107 respectively.

The current limit threshold unit 106 includes an overcurrent threshold selector and an OCP comparator.

The overcurrent threshold selector is configured to receive the output signal of the external magnetic field direct detection unit 105 and select a corresponding threshold voltage. A first input end of the overcurrent threshold selector serves as the first input end of the current limit threshold unit 106 and is electrically connected to the output end of the first comparator 204. A second input end of the overcurrent threshold selector is electrically connected to the first threshold voltage; a third input end of the overcurrent threshold selector is electrically connected to the second threshold voltage; and an output end of the overcurrent threshold selector is electrically connected to a first input end of the OCP comparator. It should be emphasized herein that a value of the second threshold voltage is not less than (namely greater than or equal to) a value of the first threshold voltage.

The OCP comparator is configured to limit a maximum current flowing through the magnetic element 101. The first input end of the OCP comparator is electrically connected to the output end of the overcurrent threshold selector. A second input end of the OCP comparator serves as the second input end of the current limit threshold unit 106 and is electrically connected to the current sampling terminal. An output end of the OCP comparator serves as the output end of the current limit threshold unit 106 and is electrically connected to the first input end of the logic unit 109.

Figure 3:
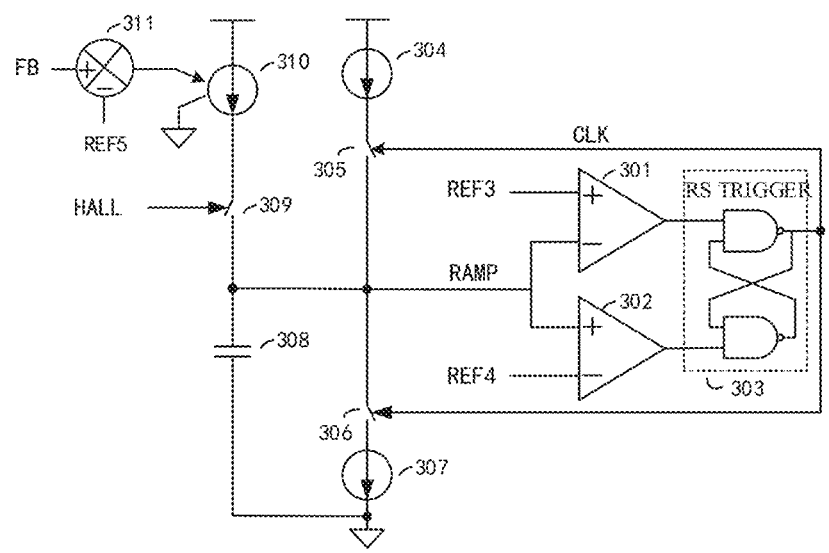
FIG. 3 is a schematic diagram illustrating a structure of an operating frequency unit.

As shown in FIG. 3, the operating frequency unit 107 includes a second comparator 301, a third comparator 302, an RS trigger 303, a second current source 304, a third current source 307, a first switch 305, a second switch 306, a first capacitor 308, a third switch 309, a voltage-controlled current source 310 and a subtracter 311.

A first input end of the second comparator 301 is electrically connected to a third threshold voltage; a second input end of the second comparator 301 is electrically connected to an end of the first capacitor 308; and an output end of the second comparator 301 is electrically connected to a first input end of the RS trigger 303.

A first input end of the third comparator 302 is electrically connected to the second input end of the second comparator 301; a second input end of the third comparator 302 is electrically connected to a fourth threshold voltage; and an output end of the third comparator 302 is electrically connected to the second input end of the RS trigger 303.

The first input end of the RS trigger 303 is electrically connected to the output end of the second comparator 301; the second input end of the RS trigger 303 is electrically connected to the output end of the third comparator 302; and the output end of the RS trigger 303 is electrically connected to a third connection end of the first switch 305 and a third connection end of the second switch 306 respectively.

An end of the second current source 304 is electrically connected to an internal power supply, and another end of the second current source 304 is electrically connected to a first connection end of the first switch 305.

An end of the third current source 307 is electrically connected to a second connection end of the second switch 306, and another end of the third current source 307 is electrically connected to the ground potential. The first connection end of the first switch 305 is electrically connected to the second current source 304; a second connection end of the first switch 305 is electrically connected to the second input end of the second comparator 301; and the third connection end of the first switch 305 is electrically connected to the output end of the RS trigger 303.

A first connection end of the second switch 306 is electrically connected to the second input end of the second comparator 301; the second connection end of the second switch 306 is electrically connected to the third current source 307; and the third connection end of the second switch 306 is electrically connected to the output end of the RS trigger 303.

An end of the first capacitor 308 is electrically connected to the second input end of the second comparator 301, and another end of the first capacitor 308 is electrically connected to the ground potential.

A first connection end of the third switch 309 is electrically connected to a fourth connection end of the voltage-controlled current source 310, and a second connection end of the third switch 309 is electrically connected to the second input end of the second comparator 301. A third connection end of the third switch 309 is electrically connected to the output end of the first comparator 204, so as to receive a magnetic field detection signal HALL output by the external magnetic field direct detection unit 105.

A first connection end of the voltage-controlled current source 310 is electrically connected to an output end of the subtracter 311; a second connection end of the voltage-controlled current source 310 is electrically connected to the ground potential; a third connection end of the voltage-controlled current source 310 is electrically connected to the internal power supply; and the fourth connection end of the voltage-controlled current source 310 is electrically connected to the first connection end of the third switch 309.

A first input end of the subtracter 311 is electrically connected to the output end of the feedback loop 104, so as to receive the feedback signal sent by the feedback loop 104. A second input end of the subtracter 311 is electrically connected to the fifth threshold voltage, and the output end of the subtracter 311 is electrically connected to the first connection end of the voltage-controlled current source 310.

Figure 4:
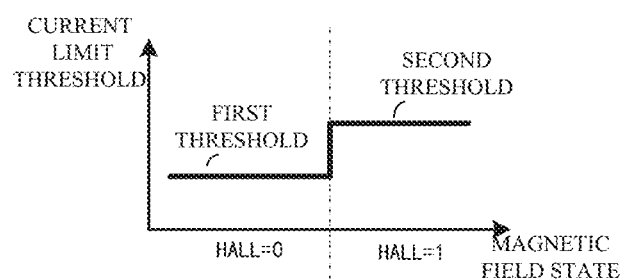
FIG. 4 is a schematic diagram illustrating a change in a current limit threshold in a current limit threshold unit.

FIG. 4 is a schematic diagram illustrating a change in a current limit threshold in the current limit threshold unit 106. When there is no external magnetic field or the intensity of the external magnetic field is very weak, the magnetic field detection signal HALL output by the external magnetic field direct detection unit 105 is a first state, for example, HALL=0, and at this time, a current limit threshold voltage of the current limit threshold unit 106 is set to be the first threshold voltage. When there is an external magnetic field and the intensity of the external magnetic field is greater than a certain magnetic field intensity threshold, the magnetic field detection signal HALL output by the external magnetic field direct detection unit 105 is a second state, for example, HALL=1, and at this time, the current limit threshold voltage of the current limit threshold unit 106 is set to be the second threshold voltage that is greater than or equal to the first threshold voltage.

Figure 5:
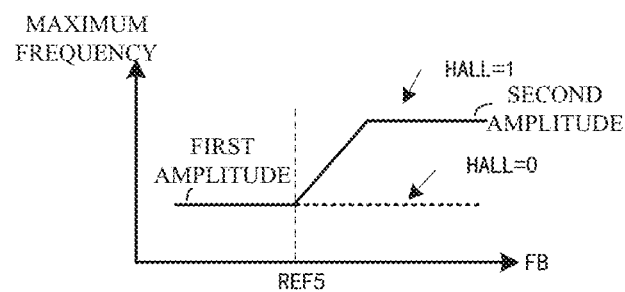
FIG. 5 is a schematic diagram illustrating a change in a maximum frequency in an operating frequency unit.

FIG. 5 is a schematic diagram illustrating a change in a maximum frequency in the operating frequency unit 107. When there is no external magnetic field or the intensity of the external magnetic field is very weak, the magnetic field detection signal HALL output by the external magnetic field direct detection unit 105 is the first state, for example, HALL=0, and at this time, the maximum frequency output by the operating frequency unit 107 is set to be a first amplitude. When there is an external magnetic field and the intensity of the external magnetic field is greater than the certain magnetic field intensity threshold, the magnetic field detection signal HALL output by the external magnetic field direct detection unit 105 is the second state, for example, HALL=1, and at this time, a maximum value of the frequency signal CLK at the output end of the RS trigger 303 in the operating frequency unit 107 is controlled by the difference between the output feedback signal and the fifth threshold voltage, and gradually increases to the second amplitude on the basis of the first amplitude. The second amplitude is greater than or equal to the first amplitude.

Figure 6:
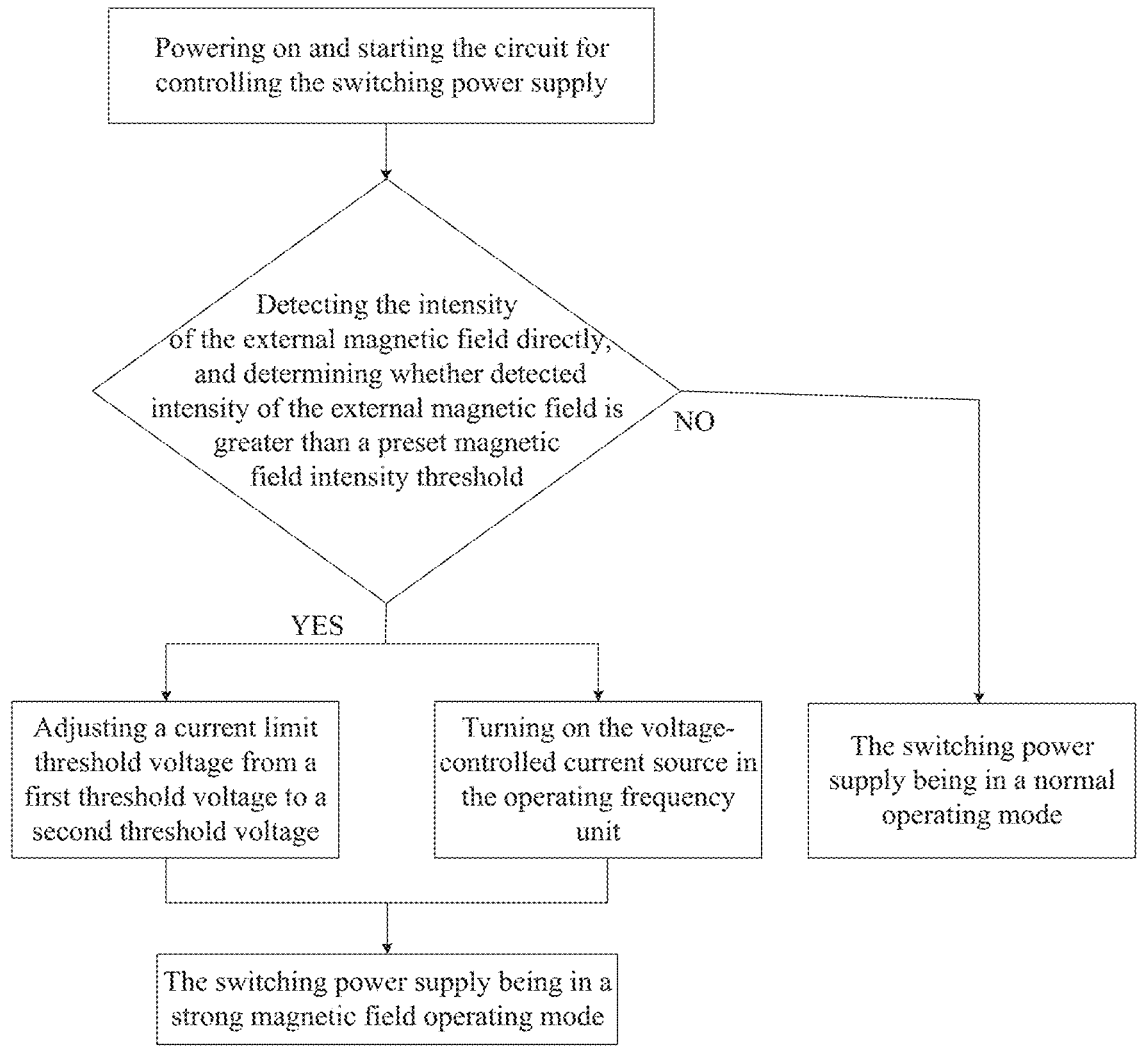
FIG. 6 is a schematic flowchart illustrating a method for controlling a switching power supply of the present disclosure.

The present disclosure also discloses a method for controlling a switching power supply by using the circuit 100 for controlling the switching power supply described above. As shown in FIG. 6, the method includes the following steps.

At step S1, power on and start the circuit 100 for controlling the switching power supply.

At step S2, intensity of the external magnetic field is detected directly by the external magnetic field direct detection unit, and the detected intensity of the external magnetic field is compared with a preset magnetic field intensity threshold;
    if the detected intensity of the external magnetic field is greater than the preset magnetic field intensity threshold, then step S3 is performed in sequence;
    if the detected intensity of the external magnetic field is not greater than (namely less than or equal to) the preset magnetic field intensity threshold, then jump to step S4.

At step S3, the switching power supply is set in a strong magnetic field operating mode, in which the current limit threshold unit 106 adjusts a current limit threshold voltage from a first threshold voltage to a second threshold voltage, and the voltage-controlled current source 310 in the operating frequency unit 107 is then turned on. A value of the second threshold voltage is not less than (namely greater than or equal to) a value of the first threshold voltage.

At step S4, the switching power supply is always kept in a normal operating mode, in which the current limit threshold unit 106 keeps the current limit threshold voltage being the first threshold voltage, and the voltage-controlled current source 310 in the operating frequency unit 107 remains off.

Generally, in accordance with the circuit 100 for controlling the switching power supply of the present disclosure, the intensity of the external magnetic field can be detected directly at the chip level, and the operating mode of the switching power supply system can be adjusted timely. Compared with a traditional technical solution, the number of discrete components in an external magnetic field detection section of the switching power supply is greatly reduced, and a whole cost for manufacturing the switching power supply system is reduced.

Secondly, in accordance with the circuit 100 for controlling the switching power supply of the present disclosure, after the intensity of the external magnetic field is detected, and the voltage-controlled current source 310 in the operating frequency unit 107 is turned on, a maximum frequency output by the operating frequency unit 107 will be linearly controlled by the feedback signal, rather than the frequency is simply changed from a first preset value to a second preset value abruptly. Such an operation mode can improve operating stability of the switching power supply system effectively and avoid system oscillations.

Further, the circuit 100 for controlling the switching power supply of the present disclosure can detect the external magnetic field directly and perform a corresponding logic control, and a judgment is made without detecting other signals inside the control circuit. In such a way, not only accuracy of a detection result is ensured, but also a response speed of the whole switching power supply system is faster, and in the magnetic field, an adjustment period for an output is shorter.

The circuit 100 for controlling the switching power supply of the present disclosure can be directly applied to a smart electric meter interfered by the external magnetic field. When there is no magnetic field outside the smart electric meter or the intensity of the magnetic field is not greater than a threshold, the switching power supply system is in the normal operating mode. At this time, the current limit threshold of the current limit threshold unit 106 is the first threshold voltage, and the voltage-controlled current source 310 in the operating frequency unit 107 is turned off. However, when the intensity of the magnetic field outside the smart electric meter is greater than the threshold, the switching power supply system is switched to the strong magnetic field operating mode. At this time, the current limit threshold unit 106 adjusts the current limit threshold voltage to the second threshold voltage, and the voltage-controlled current source 310 in the operating frequency unit 107 is turned on. By switching between the above operating modes, the operating stability of the switching power supply can be effectively improved, and interference of the magnetic field on the switching power supply can be reduced.

Finally, the present disclosure also provides a reference for other related problems in the same field, and can be extended on the basis of the present disclosure, so as to be applied to related solutions of control technologies of other switching power supplies in the field. The present invention has a very broad application prospect.

For those skilled in the art, it is obvious that the present invention is not limited to the details of the above exemplary embodiments, and that the present invention can be implemented in other specific forms without departing from the spirit and basic features of the present disclosure. Therefore, from any point of view, the embodiments should be regarded as exemplary and non-limiting. The scope of the present disclosure is defined by the appended claims rather than the above description. It is therefore intended that all variations falling within the meaning and the scope of the equivalents of the claims should be encompassed within the present disclosure, and the reference numerals in the claims should not be regarded as limiting the claims involved.

In addition, it should be understood that although the description is described according to the embodiments, but not each embodiment includes only one independent technical solution. This description of the description is for clarity only, and those skilled in the art should take the description as a whole. The technical solutions in the embodiments can also be combined appropriately to form other implementations that can be understood by those skilled in the art.

What is claimed is:

1. A circuit for controlling a switching power supply, configured to control a power stage circuit of a converter of the switching power supply, and comprising:

an external magnetic field direct detection unit, comprising a Hall device and a Hall detection component, and configured to: detect an intensity of an external magnetic field directly, and generate a corresponding logic signal to control a switching frequency output by the operating frequency unit and to adjust a current limit threshold in the current limit threshold unit, wherein the Hall device is configured to detect intensity of the external magnetic field directly and convert the intensity of the external magnetic field into an internal voltage signal, and the Hall detection component is configured to receive the internal voltage signal generated by the Hall device, and generate the corresponding logic signal after amplification and comparison;

a current limit threshold unit configured to receive an output signal of the external magnetic field direct detection unit and limit a maximum current flowing through a magnetic element in the power stage circuit;

an operating frequency unit controlled by the external magnetic field direct detection unit and a feedback signal processed by a feedback loop, and configured to generate a corresponding frequency signal to control a power switching transistor in the power stage circuit to turn on or off;

a pulse width unit configured to receive the feedback signal processed by the feedback loop and a sampling signal at a current sampling terminal, and control an on-off duty ratio of the power switching transistor in the power stage circuit; and a logic unit configured to receive output signals from the current limit threshold unit, the operating frequency unit and the pulse width unit, and perform a logic processing and generate a corresponding driving signal to control the power switching transistor in the power stage circuit to turn on or off;

wherein: the power stage circuit comprises at least the magnetic element, an output unit, the power switching transistor, a sampling resistor, and the converter of the switching power supply comprises the feedback loop;

the power switching transistor is electrically connected to the sampling resistor, and a position in a connection between the power switching transistor and the sampling resistor is the current sampling terminal of the circuit for controlling the switching power supply;

the feedback loop is electrically connected to the operating frequency unit and the pulse width unit respectively;

an input end of the external magnetic field direct detection unit is magnetically connected to the external magnetic field, and an output end of the external magnetic field direct detection unit is electrically connected to a first input end of the current limit threshold unit and a first input end of the operating frequency unit respectively;

the first input end of the current limit threshold unit is electrically connected to the output end of the external magnetic field direct detection unit; a second input end of the current limit threshold unit is electrically connected to the current sampling terminal; and an output end of the current limit threshold unit is electrically connected to a first input end of the logic unit;

the first input end of the operating frequency unit is electrically connected to the output end of the external magnetic field direct detection unit a second input end of the operating frequency unit is electrically connected to an output end of the feedback loop; and an output end of the operating frequency unit is electrically connected to a second input end of the logic unit;

a first input end of the pulse width unit is electrically connected to the output end of the feedback loop; a second input end of the pulse width unit is electrically connected to the current sampling terminal; and an output end of the pulse width unit is electrically connected to a third input end of the logic unit; and the first input end of the logic unit is electrically connected to the output end of the current limit threshold unit; the second input end of the logic unit is electrically connected to the output end of the operating frequency unit; the third input end of the logic unit is electrically connected to the output end of the pulse width unit; and the output end of the logic unit is electrically connected to the power switching transistor.

2. The circuit for controlling the switching power supply of claim 1, wherein the Hall device is a chip-level Hall device integrated in a switching power supply chip, and an integrated Hall device is formed by combining one or more process devices.

3. The circuit for controlling the switching power supply of claim 1, wherein an external shape of the Hall device is center symmetrical and has four ports for connection; a first port and a second port are arranged along a diagonal direction of the Hall device; and a third port and a fourth port are arranged in another diagonal direction of the Hall device.

4. The circuit for controlling the switching power supply of claim 3, wherein the Hall detection component comprises a first current source, a first amplifier, and a first comparator;
an output of the first current source is electrically connected to the first port of the Hall device, and the second port of the Hall device is electrically connected to a ground potential;
a first input end of the first amplifier is electrically connected to the third port of the Hall device; a second input end of the first amplifier is electrically connected to the fourth port of the Hall device; a first output end of the first amplifier is electrically connected to a first input end of the first comparator; and a second output end of the first amplifier is electrically connected to a second input end of the first comparator;
the first input end of the first comparator is electrically connected to the first output end of the first amplifier; the second input end of the first comparator is electrically connected to the second output end of the first amplifier; and an output end of the first comparator serves as the output end of the external magnetic field direct detection unit and is electrically connected to the first input end of the current limit threshold unit and the first input end of the operating frequency unit respectively.

5. The circuit for controlling the switching power supply according to claim 4, wherein
the first current source is configured to cooperate with the Hall device to detect the intensity of the external magnetic field;
the first amplifier is configured to receive an internal voltage signal generated by the Hall device, amplify the internal voltage signal and input an amplified internal voltage signal into the first comparator; and
the first comparator is configured to receive an output signal of the first amplifier and generate a corresponding logic output signal.

6. The circuit for controlling the switching power supply of claim 4, wherein the current limit threshold unit comprises an overcurrent threshold selector and an OCP comparator;
a first input end of the overcurrent threshold selector serves as the first input end of the current limit threshold unit and is electrically connected to the output end of the first comparator; a second input end of the overcurrent threshold selector is electrically connected to a first threshold voltage; a third input end of the overcurrent threshold selector is electrically connected to a second threshold voltage; and an output end of the overcurrent threshold selector is electrically connected to a first input end of the OCP comparator;
the first input end of the OCP comparator is electrically connected to the output end of the overcurrent threshold selector; a second input end of the OCP comparator serves as the second input end of the current limit threshold unit and is electrically connected to the current sampling terminal; and an output end of the OCP comparator serves as the output end of the current limit threshold unit and is electrically connected to the first input end of the logic unit.

7. The circuit for controlling the switching power supply according to claim 6, wherein the operating frequency unit comprises a second comparator, a third comparator, an RS trigger, a second current source, a third current source, and a first switch, a second switch, a first capacitor, a third switch, a voltage-controlled current source and a subtracter;
a first input end of the second comparator is electrically connected to a third threshold voltage; a second input end of the second comparator is electrically connected to an end of the first capacitor; and an output end of the second comparator is electrically connected to a first input end of the RS trigger;
a first input end of the third comparator is electrically connected to the second input end of the second comparator; a second input end of the third comparator is electrically connected to a fourth threshold voltage; and an output end of the third comparators is electrically connected to a second input end of the RS trigger;
the first input end of the RS trigger is electrically connected to the output end of the second comparator; the second input end of the RS trigger is electrically connected to the output end of the third comparator; and an output end of the RS trigger is electrically connected to a third connection end of the first switch and a third connection end of the second switch respectively;
an end of the second current source is electrically connected to an internal power supply, and another end of the second current source is electrically connected to a first connection end of the first switch;
an end of the third current source is electrically connected to a second connection end of the second switch, and another end of the third current source is electrically connected to the ground potential;
the first connection end of the first switch is electrically connected to the second current source; a second connection end of the first switch is electrically connected to the second input end of the second comparator; and the third connection end of the first switch is electrically connected to the output end of the RS trigger;
a first connection end of the second switch is electrically connected to the second input end of the second comparator; the second connection end of the second switch is electrically connected to the third current source; and the third connection end of the second switch is electrically connected to the output end of the RS trigger;
an end of the first capacitor is electrically connected to the second input end of the second comparator, and another end of the first capacitor is electrically connected to the ground potential;
a first connection end of the third switch is electrically connected to a fourth connection end of the voltage-controlled current source; a second connection end of the third switch is electrically connected to the second input end of the second comparator; and a third connection end of the third switch is electrically connected to the output end of the first comparator;
a first connection end of the voltage-controlled current source is electrically connected to an output end of the subtracter; a second connection end of the voltage-controlled current source is electrically connected to the ground potential; a third connection end of the voltage-controlled current source is electrically connected to the internal power supply; and the fourth connection end of the voltage-controlled current source is electrically connected to the first connection end of the third switch;

a first input end of the subtracter is electrically connected to the output end of the feedback loop; a second input end of the subtracter is electrically connected to a fifth threshold voltage; and the output end of the subtracter is electrically connected to the first connection end of the voltage-controlled current source.

8. The circuit for controlling the switching power supply according to claim 6, wherein the overcurrent threshold selector is configured to receive the output signal of the external magnetic field direct detection unit and select a corresponding threshold voltage, and the OCP comparator is configured to limit a maximum current flowing through the magnetic element.

9. A method for controlling a switching power supply, comprising steps of:

powering on and starting a circuit for controlling the switching power supply;

detecting, by an external magnetic field direct detection unit, an intensity of an external magnetic field directly, and comparing the detected intensity of the external magnetic field with a preset magnetic field intensity threshold;

if the detected intensity of the external magnetic field is greater than the preset magnetic field intensity threshold, setting the switching power supply to be in a strong magnetic field operating mode, in which a current limit threshold unit adjusts a current limit threshold voltage from a first threshold voltage to a second threshold voltage, and a voltage-controlled current source in an operating frequency unit is then turned on, wherein a value of the second threshold voltage is not less than a value of the first threshold voltage;

if the detected intensity of the external magnetic field is not greater than the preset magnetic field intensity threshold, keeping the switching power supply always in a normal operating mode, in which the current limit threshold unit keeps the current limit threshold voltage being the first threshold voltage, and the voltage-controlled current source in the operating frequency unit remains off.

10. The method for controlling the switching power supply according to claim 9, wherein the voltage-controlled current source is controlled by a difference between a feedback signal and a fifth threshold voltage;

the feedback signal is processed by a feedback loop.

* * * * *